United States Patent

Phlipot et al.

[15] 3,674,745

[45] July 4, 1972

[54] NOVEL LIGHT-SENSITIVE COPOLYESTERS

[72] Inventors: Georges A. Phlipot; Marie-Jose-Suzanne Michiels; Yolande-Paule Marie-Josephe De Villeneuve, all of Vincennes, France

[73] Assignee: Eastman Kodak Company, Rochester, N.Y.

[22] Filed: March 12, 1970

[21] Appl. No.: 19,063

[52] U.S. Cl. .........................260/75 VA, 96/86 P, 96/115 R, 260/47 C

[51] Int. Cl. .........................................................C08g 17/10

[58] Field of Search .............................................260/75 UA

[56] References Cited

UNITED STATES PATENTS

| | | | |
|---|---|---|---|
| 2,683,100 | 7/1954 | Edgar et al | 117/128.4 |
| 2,744,091 | 5/1956 | Caldwell | 260/75 |
| 2,744,094 | 5/1956 | Caldwell | 260/75 |
| 2,956,878 | 10/1960 | Michiels | 96/33 |
| 3,556,791 | 1/1971 | Suzuki et al. | 96/35.1 |

OTHER PUBLICATIONS

Edgar et al., J. Chem. Soc. 1952, 2633–2643
Izard, J. Polym. Sci. 8, 503–517(1952)

*Primary Examiner*—Melvin Goldstein
*Attorney*—William H. J. Kline, James R. Frederick and Joshua G. Levitt

[57] ABSTRACT

There is described a novel group of light-sensitive copolyesters prepared by condensing at least one dihydroxy compound with a mixture of diacids comprising more than 70 and less than 95 mole percent of a diacid having the formula:

$$R{=}CH{-}CH{=}C\begin{matrix} \diagup COOH \\ \diagdown COOH \end{matrix}$$

where R is an alkylidene, aralkylidene or heterocyclic group and less than 30 but more than 5 mole percent of a non-light-sensitive aromatic diacid.

6 Claims, No Drawings

NOVEL LIGHT-SENSITIVE COPOLYESTERS

This invention relates to novel light-sensitive polyesters and to processes for preparing these light-sensitive polyesters.

It is well known that certain polymers, which initially are soluble in organic solvents, become insoluble in the same solvents after exposure to an appropriate light source. Thus, if one of these polymers is coated on a support and imagewise exposed to actinic radiation, the exposed areas become insoluble and the unexposed areas, which have remained soluble, can then be removed. A polymeric image is obtained on the support, which can be used in photomechanical reproduction processes.

The light-sensitive polymer which can be utilized in this way comprise, in particular, those having residual unsaturations capable of causing crosslinking of the polymer upon exposure to actinic radiation. In U.S. Pat. No. 2,956,878 and French Pat. No. 1,137,056, hereinafter referred to as the afore-cited patents, there is described a particular group of light-sensitive polyesters which can be prepared by condensing the ester of an acid, such as cinnamylidenemalonic acid, with diols or phenols. The homopolyesters described in these patents are light-sensitive resins and have, moreover, properties that make them usable in photoengraving and lithography. These resins are hard, transparent, insoluble in water but soluble in organic solvents (e.g., ketones, chlorinated hydrocarbons, aromatic hydrocarbons, ethers, etc.), but after having been exposed to actinic radiation they become insoluble in the aforesaid solvents. Moreover, they are insoluble in the acid baths used in photoengraving, e.g., ferric chloride, nitric acid, etc. Furthermore, these resins are oleophilic and hence display a good affinity for lithographic inks.

As indicated above, after imagewise exposure of a layer of a light-sensitive resin, such as is described in the aforecited patents, an image is developed by removing the unexposed areas of the layer with a solvent which, advantageously, is a chlorinated solvent such as trichloroethylene. This solvent development operation must leave intact the exposed areas of the layer, which constitute a negative of the original. However, it has been found that the solvents used for development, not only selectively remove the unexposed areas, but also penetrate into the exposed areas of the light-sensitive layer. Even though the washing is effected by simply flowing a stream of solvent over the layer of homopolyester that has been exposed and crosslinked, the solvent causes the exposed areas to swell thereby rendering them very fragile and reducing their utility as a resist. Moreover, during drying, the fine details in the swollen areas may not resume the exact shape that they had initially, which affects the definition of the final image.

It is apparent, therefore, that by increasing the resistance of this type of polyester to swelling in developing solvents, such as trichloroethylene, one is able to improve the definition and the exposure latitude of the photosensitive elements which use them. Moreover, by improving the mechanical properties and the dimensional stability of this type of photosensitive polyester, it becomes possible to process elements prepared from them in automatic processing machines in which one uses an etching bath which contains organic solvents.

Accordingly, it is an object of this invention to provide novel photosensitive polyesters which have improved physical properties.

It is another object of this invention to provide novel photosensitive polyesters which have increased resistance to swelling in organic development solvents.

It is yet another object of this invention to provide novel photosensitive polyesters which are capable of yielding images of improved definition.

It is still another object of this invention to provide novel photosensitive elements, employing the novel photosensitive polyesters, which can be processed in automatic processing machines.

These and other objects of this invention will become apparent to those skilled in the art from the further description of this invention which follows.

We have found that by replacing in the polyesters described in the afore-cited patents a certain amount of the photosensitive units with an equivalent amount of units derived from a non-photosensitive aromatic diacid or a derivative of such a diacid, the mechanical properties of the final polymer are considerably improved.

The copolyesters of the present invention consist of the condensation product of at least one dihydroxy compound with a mixture of diacids, more than 70 and less than 95 mole percent of the diacids having the formula:

I

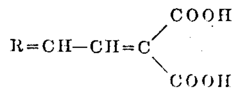

wherein R represents an alkylidene, aralkylidene or heterocyclic group, or of a derivative of such a diacid, and more than 5 but less than 30 mole percent of the diacids being a non-light-sensitive aromatic diacid or a derivative of such a diacid.

The copolyesters of the invention can be prepared by polycondensation of a photosensitive acid of the above-indicated type and an aromatic diacid with a dihydroxy compound or a mixture of dihydroxy compounds. In the place of the diacids themselves, derivatives of these acids may be used advantageously, in particular the corresponding diesters. Likewise, derivatives of dihydroxy compounds can be used.

Examples of diacids that correspond to the above general formula I and that are usable according to the present invention, are described in the afore-cited patents and include cinnamylidenemalonic acid, crotonylidenemalonic acid, γ-methylcrotonylidenemalonic acid, o-nitrocinnamylidenemalonic acid, naphthylallylidenemalonic acid, 2-furfurylidenemalonic acid, N-methylpyridylidene-2-ethylidenemalonic acid, N-methylquinolidene-2-ethylidenemalonic acid, N-methylbenzothiazolylidene-2-ethylidene-malonic acid, and the like, as well as functional derivatives of these acids, p-dimethyl amino cinnamylidenemalonic acid.

As suitable non-light-sensitive aromatic diacids there can be mentioned terephthalic acid, isophthalic acid, and the like, as well as functional derivatives of these acids.

A particularly preferred embodiment of the invention uses as the light-sensitive diacid, cinnamylidenemalonic acid or a functional derivative of this acid, for example, a lower alkyl diester, such as methylcinnamylidenemalonate or ethylcinnamylidenemalonate, and as the non-light-sensitive acid, a lower alkyl terephthalate such as methylterephthalate or ethylterephthalate.

As has been indicated above, the use of a non-photosensitive aromatic diacid or diester, which represents, according to the present invention, a molar percentage of more than 5 and less than 30 mole percent of the total quantity of diacid or diester, results in an improvement in certain physical characteristics of the copolyester compared with the corresponding light-sensitive homopolyester. A slight increase of the softening temperature and a decrease in the degree of solubility in organic solvents is obtained. Surprisingly, even an improvement in the photosensitivity of the copolyesters is noted when the molar quantity of non-photosensitive aromatic diacid or diester represents no more than 10 mole percent of the total quantity of diacid or diesters. Finally, if this quantity of non-photo-sensitive aromatic diacid or diester represents 30 mole percent or more of the total quantity of diacids or diesters, the improvement of the mechanical properties of the copolyesters is accompanied by a decrease in their photosensitivity.

The mixture of diacids or diesters of the present invention can be condensed with the dihydroxy compounds using, in particular, those aliphatic and aromatic diols mentioned in the afore-cited patents such as alkylene glycols containing about 2 to 12 carbon atoms, for example, ethylene glycol, diethylene glycol, triethylene glycol, 1,3-propanediol, 1,2-pro-panediol, 1,4-butanediol, 2,3-butanediol, 1,5-pentanediol, 2,2-dimethyl-1,3-propanediol, cyclohexanedimethanol, decamethylene glycol, dodecamethylene glycol, and aromatic diols, for example, hydroquinone, p-dihydroxymethylbenzene, etc.

It has been noted that if a single diol such as ethylene glycol or cyclohexanedimethanol is used, the polymers which are obtained have a low rate of swelling in organic solvents and have a high melting point. Unfortunately, these polymers do not have, in general, a sufficiently great molecular weight and their sensitivity, as well as their mechanical properties are not completely satisfactory. It is possible to remedy this disadvantage by employing in addition to the mixture of diacids and diesters more than one dihydroxy compound or diol to prepare the copolyesters of this invention. According to a preferred embodiment, this mixture of dihydroxy compounds comprises two or more diols having the following general formula:

II HO—R′—OH wherein R′ represents an alkylene radical, preferably a lower alkylene radical having of from two to 10 carbon atoms, or a cycloalkylene radical, e.g., the alkylene moiety of which contains of from three to 10 carbon atoms.

In a preferred embodiment of this invention a mixture of ethylene glycol and 1,4-butanediol are used as the dihydroxy compounds.

The copolyesters of this invention are prepared by reacting the mixture of diacids or diesters and dihydroxy compounds following conventional polycondensation techniques, such as described in the afore-cited patents. These polycondensations typically are carried out by heating at atmospheric pressure, followed by a heating in a vacuum (pressure at about 1 mm. Hg.) The temperatures used generally range between 150° and 235°C. Within this range the temperature has little influence on the molecular weight of the copolyester obtained, although the molecular weight generally increases with an increase in the duration of the heating.

The catalysts which can be used are those that are generally used for the preparation of macromolecular linear polyesters. Suitable catalysts include titanium esters such as butyl titanate, and titanium isopropoxide, antimony oxide, strontium oxide, zinc acetate, etc. When a diacid is used as the starting material for direct polyesterification then sulfuric acid, p-toluene sulfonic acid, etc., can be used as catalyst.

Coating compositions containing the light-sensitive copolyesters of this invention can be prepared by dispersing or dissolving the polyester in any suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents. Typically the light-sensitive copolyester is employed in the coating composition in the range from about 1 to 20 percent by weight. Preferably the copolyester comprises 2 to 10 percent by weight of the composition in a solvent such as listed above. The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Although the copolyesters of this invention are capable of yielding resists without additional sensitization, it is possible to increase their photosensitivity by adding suitable sensitizers to the photosensitive layer. Suitable compounds that can be used as sensitizers are mentioned in the afore-cited patents as well as French Pat. No. 1,238,262 and include 2-(benzoylmethylene)-1-methyl-β-naphthothiazole, 2-benzoylcarbethoxymethylene-1-methyl-β-naphthothiazole, 1-carbethoxy-2-keto-3-methyl-2azabenzanthrone, eosin, etc. Other sensitizers are described, for example, in French Pat. No. 1,086,257 of Jan. 19, 1952, French Pat. No. 1,089,290 of Oct. 14, 1953, U.S. Pat. No. 2,610,120 (nitro compounds), U.S. Pat. No. 2,690,966 (triphenylmethanes), U.S. Pat. No. 2,670,285 (anthrones), U.S. Pat. 2,670,287 (diaminobenzophenone imides, -diphenyl-methanes, -diphenyl ketones, -diphenylcarbinols), U.S. Pat. No. 2,670,286 (quinones), and U.S. Pat. No. 2,732,301, (thiazoles, thiazolines, cyanine dyes, etc.). Also, it has been found that photosensitive products of especially high speeds are obtained when methyl-2-(N-methylbenzothiazolylidene) dithioacetate, is used as the sensitizer.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly-(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive copolyester employed, and the nature of other components which may be present in the coating.

As has been indicated above, by imagewise exposing to actinic radiation a photosensitive element consisting of a layer of a copolyester of the present invention, and by developing the unexposed areas with a solvent, a relief image is obtained. This relief can be used for the preparation of lithographic plates by producing an inkable resist. One may also use these copolyesters for the manufacture of typographic reliefs, cylinders for heliography, electronic micromodules or circuits, etc., or for the chemical etching of metallic pieces. In such products the copolyesters are most often employed in the form of very thin layers having a thickness of approximately 1 to 10 microns and sometimes less than a micron, the main characteristics of which are the high resolving power, the chemical inertness and good preservation of sensitivity.

The increase of the melting point and the decrease of permeability to certain solvents make possible the autopositive reproduction of halftone negatives by means of a pigmentation technique. After exposure the negative, uncrosslinked polymeric image, is heated above the softening point of the resin or it is treated with a swelling agent followed by contacting it with a pigment so that pigment adheres to the resin in these areas. Permanent images can thus be obtained, e.g., on a support of enameled sheet iron, ceramic or glass, by using a pigment that is vitrifiable at high temperature, and firing the pigmented image to burn out the resin and vitrify the pigment.

The following examples further illustrate this invention.

EXAMPLE 1

In a flask equipped with a refluxing head and a downward-directed condenser, there is heated under nitrogen at 200° C., a mixture having the following composition:

| | |
|---|---|
| Methyl cinnamylidenemalonate | 775 g (3.15 moles) |
| Methyl terephthalate | 97 g (0.5 mole) |
| Ethylene glycol | 372 g (6 moles) |
| 1,4-Butanediol | 180 g (2 moles) |

After heating for 30 minutes, there is added 2 ml of a 20 percent solution of isopropyl titanate in butanol. After heating for 5 hours, 300 ml of methanol have been distilled off. The dope is then poured into a reactor provided with a stirrer, a vapor condenser and connected to a vacuum pump. The pressure is then slowly lowered until it reaches 1 to 2 mm Hg. and the temperature is raised to 230° C. A mixture of excess ethylene glycol and butanediol is collected at the condenser, and, after 3 hours of heating, the polymer is removed through the drainage orifice of the reactor, and it is rapidly cooled.

EXAMPLE 2

A mixture is prepared having the following composition:

| | |
|---|---|
| Methyl cinnamylidenemalonate | 861 g (3.5 moles) |
| Methyl terephthalate | 97 g (0.5 mole) |
| Ethylene glycol | 248 g (4 moles) |
| 1,4-Butanediol | 180 g (2 moles) |
| Cyclohexane dimethanol | 288 g (2 moles) |

This mixture is placed in a flask provided with a stillhead and it is heated at 200° C. After heating for one-half hour, 2 ml. of a catalyst are added (20 percent solution of isopropyl titanate in butanol). After heating for 6 hours, 300 ml of distillate have been collected. The reaction product is then placed in the reactor as in Example 1, and it is heated under vacuum at 230° C. for 2 hours. Then the polyester is discharged and it is rapidly cooled.

EXAMPLE 3

This example illustrates the advantages of the copolyesters of the invention compared with a similar homopolyester. A "-microzinc" plate is coated with a layer of the copolyester described in Example 1 and another "microzinc" plate is coated with a layer of a homopolyester (tetramethyl cinnamylidenemalonate). These "microzinc" plates are used in a conventional manner for machine typographic etching. The coverage is 2.7 g per square meter in each case. The two plates are exposed under the same conditions through a line and halftone negative. After development with trichloroethylene, the two plates are dried at 120° C. for 10 minutes, then their surfaces are cleaned by rubbing them with a cotton wad and whiting (calcium carbonate). They are then immersed for 30 seconds in a 3 percent nitric acid solution. The plates are then placed in an etching machine such as the MARK III Powderless Etching Machine manufactured by the Tasope Company. The etching bath has the following composition:

| | |
|---|---|
| Nitric acid 42° B. | 8 liters |
| "Mona Etch" surfactant sold by Mona Industries Co. | 0.696 kg. |
| "Solvesso 150" solvent sold by Esso | 2.784 kg. |
| Water | 49.7 liters |

The etching temperature is 27° C. After 10 minutes of etching, the homopolyester resist has separated from the plate and fallen into the bath, while the copolyester resist remains in place and permits the etching to continue for an additional 10 minutes.

EXAMPLE 4

To a 15 percent solution in 2-methoxyethyl acetate of the polymer obtained in Example 2, there is added 0.45 percent of methyl N-methyl-benzothiazolylidenedithioacetate, in order to extend the spectral sensitivity. This solution is whirl coated at 80 rpm on the copper side of a stratified copper-bakelite plate. After drying, the sensitive surface is exposed in a vacuum frame through an N.B.S. test pattern. Another plate is coated in the same manner with a homopolyester, tetramethylene polycinnamylidenemalonate, and it is then exposed under the same conditions. The two plates are developed by simultaneously spraying them with trichloroethylene. The development apparatus comprises nozzles placed at 30 cm. from the plates, and providing two types of spraying, one very direct and the other in the form of a fine mist. After a few seconds, the image is perfectly developed on the plate that is coated with the copolyester prepared according to Example 2. All the fine details are in place, even when direct spraying is used. Whereas on the plate that is coated with the homopolyester, even with mist spraying certain details are removed and direct spraying completely destroys the image.

The invention has been described in detail with particular reference to preferred embodiments thereof, but it will be understood that variations and modifications can be effected within the spirit and scope of the invention.

What is claimed is:

1. A light-sensitive copolyester condensation product of at least one dihydroxy compound with a mixture of diacids or derivatives thereof, more than 70 and less than 95 mole percent of the diacids being a light-sensitive diacid or derivative thereof having the formula:

$$R=CH-CH=C\begin{matrix}\nearrow COOH\\ \searrow COOH\end{matrix}$$

wherein R is an alkylidene, aralkylidene or heterocyclic group and less than 30 but more than 5 mole percent of the diacids being a non-light sensitive aromatic diacid selected from the group consisting of terephthalic acid, isophthalic acid and derivatives thereof.

2. A copolyester of claim 1 wherein the dihydroxy compound is an alkylene glycol having two to 12 carbon atoms.

3. A copolyester of claim 1 wherein the non-light-sensitive aromatic diacid comprises 10 mole percent or less of the diacids, the remainder being light-sensitive diacids.

4. A copolyester of claim 1, wherein the non-light-sensitive aromatic diacid is terephthalic acid, and the dihydroxy compound is a mixture of ethylene glycol and 1,4-butanediol.

5. A copolyester of claim 1, wherein the non-light-sensitive aromatic diacid is terephthalic acid, and the dihydroxy compound is a mixture of ethylene glycol, 1,4-butanediol, and cyclohexanedimethanol.

6. A light-sensitive copolyester condensation product of at least one dihydroxy compound selected from the group consisting of ethylene glycol, 1,4-butanediol, cyclohexanediol and mixtures thereof with a mixture of diacids or derivatives thereof, more than 70 and less than 95 mole percent of the diacids being a light sensitive diacid selected from the group consisting of cinnamylidene malonic acid and low alkyl esters thereof and less than 30 but more than 5 mole percent of the diacids being non-light sensitive aromatic diacid selected from the group consisting of terephthalic acid, isophthalic acid and lower alkyl esters thereof.

* * * * *